United States Patent [19]

Veneklasen

[11] 4,337,422

[45] Jun. 29, 1982

[54] FIELD EMISSION GUN WITH NOISE COMPENSATION

[75] Inventor: Lee H. Veneklasen, Castro Valley, Calif.

[73] Assignee: The Perkin-Elmer Corporation, Norwalk, Conn.

[21] Appl. No.: 131,205

[22] Filed: Mar. 17, 1980

[51] Int. Cl.[3] .......................... H01J 29/52

[52] U.S. Cl. .......................... 315/383

[58] Field of Search .......................... 315/383, 30, 381

[56] References Cited

U.S. PATENT DOCUMENTS 3,887,839 6/1975 Ota et al. .......................... 315/383

*Primary Examiner*—Theodore M. Blum

*Attorney, Agent, or Firm*—S. A. Giarratana; E. T. Grimes; T. P. Murphy

[57] ABSTRACT

A field emission gun, for either electron or positive ion emission, in which the beam current between source and sample is measured at accelerating voltage potential between two concentric shields that enclose the gun, its power supplies, and the measuring circuitry. The outer shield is directly connected to the high voltage terminal of the accelerating voltage supply while the inner shield is at the local ground reference of the emission source and associated components. The current between the concentric shields is measured, converted to a proportional voltage signal, compared with the reference voltage, and applied to a field strength controlling electrode in the vicinity of the emission source to modulate the emission and to maintain a constant beam current.

7 Claims, 2 Drawing Figures

FIELD EMISSION GUN WITH NOISE COMPENSATION

BACKGROUND OF THE INVENTION

This invention relates to field emission guns, either electron or positive ion emission, and particularly to circuitry for the accurate measurement and control of the current in that part of the beam actually being used, and for producing a correction signal that may be applied to a control electrode for beam noise compensation.

Noise produced by contamination and erosion of the pointed field emission source in the high vacuum used for field emission applications results in variations in the electron or ion beam current from field emission guns. For accurate applications of such guns, this flicker noise must be eliminated or greatly reduced in that part of the beam being used. Some of the inherent noise can be reduced by refinement of cathode materials and improvement in operating conditions. It is further possible to reduce or even eliminate this flicker noise by use of feedback techniques provided that the appropriate beam current can be measured and side effects associated with de-focus and translation of the beam can be avoided.

Reduction or elimination of flicker noise by use of feedback techniques requires an accurate measurement of the beam current. In most field electron emission gun systems only a small portion of the electron beam is actually used and this small portion is directed to the sample at anode potential through a small aperture in the center of an accelerating electrode positioned near the cathode and in the path of the emitted electron beam. If the emitted beam had a uniform and constant electron density throughout, a measure of beam current could be made by sampling the current onto this accelerating anode. Unfortunately, due to an effect known as spatial correlation, the noise in the total emission current differs from that in the beam passing through the aperture in the accelerating anode so that to perform feedback noise compensation, current measurements must be made on the beam that impinges on the actual sample being exposed.

Some prior art devices recognizing the problem of spatial correlation throughout a beam, employ an annular collector from which current measurement may be made. In some prior art devices, the collector may have a small central aperture through which the central portion of the emitted beam may pass and from which a sample of beam current is obtained. Other prior art devices, such as that described in U.S. Pat. No. 3,925,706, actually measure the total usable beam current at the anode and use the measured value to generate a feedback signal to a control electrode in the vicinity of the anode. While this last described prior art method provides a measurement of beam current received at the anode, the measured current cannot always be simultaneously used, and therefore cannot provide the proper control to the beam at the cathode. Further, current measurements made at or near ground anode potential result in an error signal that must be translated to a very high negative voltage before being applied to the power supply reference to the cathode, thereby introducing additional possibility of error. Greater error occurs, however, in that the current within the emission beam is usually a small fraction of the current flowing within the high voltage loop with the remainder consisting of leakage, corona, capacitive pickup to and from the power supplies floating at high voltage, and pickup associated with the transmission of power to the supplies from ground potential. All of these items tend to introduce measurement errors between the anode and the control electrode in the vicinity of the cathode. These errors are eliminated in the circuitry described hereinafter.

Briefly described, the circuitry of the invention measures field emission current at the current emitting electrode by enclosing the emitting electrode and all of its associated power supply current measuring circuitry within a conductive shield at a local ground reference and to which all of the enclosed circuitry is thus referenced. This first shield is enclosed within, and insulated from, a second shield that is connected directly to the high voltage terminal of the accelerating voltage source which itself is referenced to earth ground. Beam current is measured between the outer or second shield at a virtual ground potential and the inner or first shield at local ground potential to produce a voltage signal that is compared with a reference level to obtain an error signal which is applied to a Wehnelt or control electrode in the vicinity of the tip of the beam current emitting electrode to thereby modulate its emission to maintain a constant beam current. By use of this double shield configuration enclosing the various circuits subject to pickup and leakage, the actual emitted beam current is readily distinguished from the spurious currents within the system.

DETAILED DESCRIPTION OF THE PREFERRED EMBODIMENT

Figure 1:
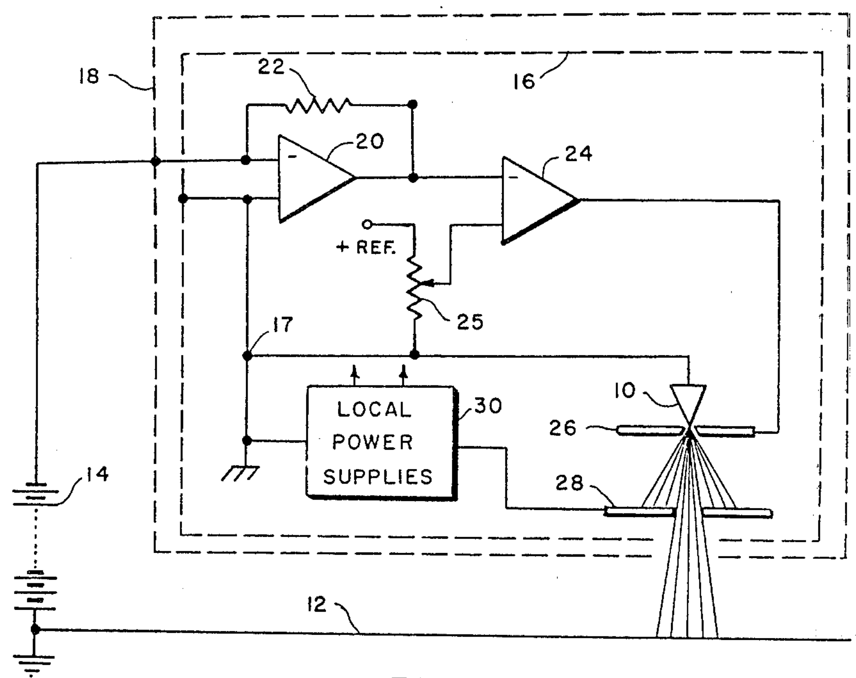
FIG. 1 is a block diagram illustrating a field emission gun and associated power supply and current measuring circuitry within a double concentric shield.

Illustrated in the schematic block diagram of FIG. 1 is a conventional field emission tip 10 which is electrically connected directly to a local ground reference and which is enclosed within a chamber (not shown) that is maintained at a high vacuum, in the order of $10^{-9}$ Torr. The pointed end of tip 10 is aligned with a small aperture in the vacuum chamber so that an electron or an ion beam emitted from the tip 10 will pass through the aperture to a sample positioned on an electrode 12 at earth ground reference.

Coupled between the earth ground electrode 12 and the circuitry associated with the emission tip 10 is a D.C. power source 14 that provides an accelerating potential to the emitted beam. If the source 14 is connected to provide a high negative potential on the electrode 12, the system may be used to produce a positive ion beam from tip 10. If, on the other hand, the source 14 is connected to apply a high positive potential to the electrode 12, as illustrated, the tip 10 will emit a beam of electrons such as required in the modern high intensity high-speed scanning electron beam systems.

As previously discussed, accurate beam current measurements are made at the potential of the cathode emission tip 10 to eliminate inaccuracies introduced in translating the current measurements made at the anode sample electrode at earth ground potential into current regulating signals near cathode potentials several thousand volts below earth ground. Furthermore, in order to eliminate measurement errors through the introduction of corona, leakage currents, etc., the current measuring circuits must be shielded from the effects of outside influences. Therefore, as illustrated in FIG. 1, a shield 16 completely encloses the current emission tip 10 and is coupled to a point 17 in the circuitry designated as local ground. This shield 16 is further enclosed within, and insulated from, a second or outer concentric shield 18 that is electrically coupled directly to the negative terminal of a high accelerating D.C. voltage power source 14. While the outer shield 18 is at a very high potential relative to the earth ground, it is at a virtual ground potential with respect to the local ground at point 17 and the inner concentric shield 16.

Beam current measurements are made at cathode potential by measuring the current between inner shield 16 and outer shield 18, thereby measuring only the current of the emitted beam striking the earth ground electrode 12. A typical current-to-voltage converter comprising an operational amplifier 20 with feedback resistor 22 is connected to sense the beam current. The inverting input terminal of amplifier 20 is coupled to the outer shield 18 and to the feedback resistor 22. The non-inverting input terminal of amplifier 20 is coupled to local ground 17 and therefore to the inner shield 16. The output voltage of amplifier 20, which is numerically equal to the product of the beam current and the feedback resistor 22, is applied to the inverting terminal of a typical operational amplifier comparator 24, the non-inverting input terminal of which is connected to a potentiometer 25 which is connected between local ground and a positive source to provide an adjustable beam current reference signal to the comparator 24. The error voltage output of the comparator 24 is then applied to a Wehnelt or control electrode 26 which is positioned very near the emission tip 10 to control the current emitted therefrom.

The embodiment illustrated in FIG. 1 employs a first anode 28 having a central aperture for passing a portion of the emitted beam to the anode electrode 12 at earth ground potential. The first anode 28 is charged to a positive potential for accelerating the emitted beam and receives its potential from one of several local power supplies 30 which also provide power to the current-to-voltage converter amplifier 20, the comparator 24 and to the current reference potentiometer 25. It will be noted that the local power supplies 30 as well as the aforementioned amplifiers 20 and 24 are contained within the inner shield 16 so that any current losses that may be attributable to these components are not included in the current measurement between the inner and outer shields 16 and 18. The current measurements are therefore made at the local ground potential of the cathode tip 10 and exclude erroneous measurements that result from the various leakage currents discussed earlier.

Figure 2:
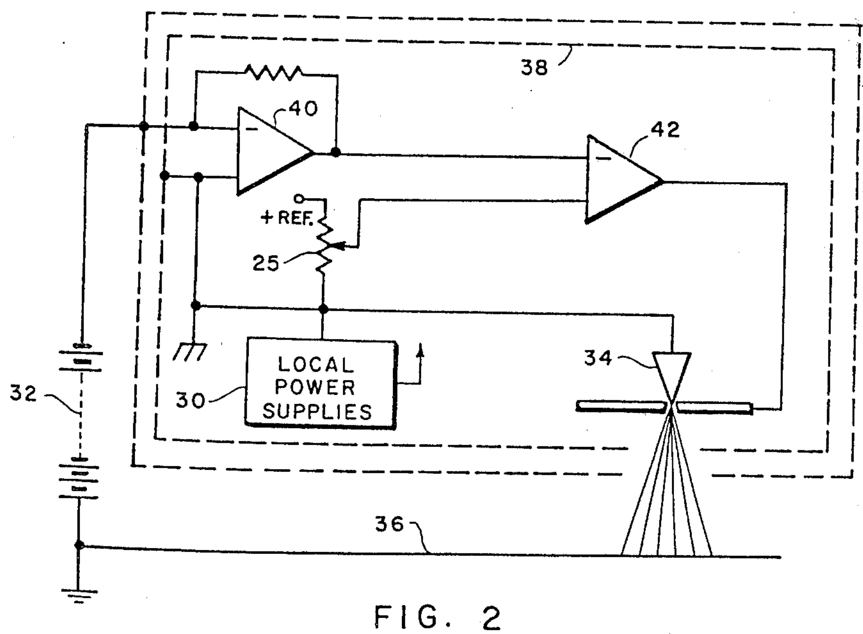
FIG. 2 is a block schematic diagram of similar circuitry together with a field emitting diode gun.

FIG. 2 is a schematic block diagram illustrating a field emission diode gun which is identical with the embodiment illustrated in FIG. 1 but which eliminates the first anode 28 of FIG. 1. The diode gun embodiment of FIG. 2 may be used where a narrow range of accelerating voltages are required so that a single high voltage power supply 32 may be used to produce the field emission accelerating beam from the emission tip 34 to the earth grounded electrode 36. In the embodiment illustrated in FIG. 2, current measurements are made in the same manner and by the same type of circuitry employed in the circuitry of FIG. 1 and local power supplies 30 are again referenced to local ground potential within the inner shield 38 for providing the necessary power to the current-to-voltage converter amplifier 40 and comparator 42.

I claim:

1. In a field emission gun system, beam regulating means for measuring beam current and for regulating beam current emerging from an emission tip at a local ground reference potential by controlling the control voltage on an adjacent control electrode, said field emission gun system having a sample electrode at earth ground potential and an accelerating potential power source having a first terminal coupled to said sample electrode at earth ground potential and a second terminal coupled to said local ground reference potential, said beam regulating means comprising;
current measuring circuitry coupled to said power source and to said emission tip for measuring current through said power source substantially at said local ground reference potential of said emission tip, said current measuring circuitry providing an output voltage proportional to said measured current;
a central electrode adjacent said emission tip, and
comparison circuitry responsive to said measuring circuitry output voltage and to a predetermined beam current reference voltage for generating an error output voltage signal to said adjacent control electrode.

2. The beam regulating means claimed in claim 1 including a first electrostatic shield and wherein said emission tip, said adjacent control electrode, said current measuring circuitry, said comparison circuitry, and local power sources associated therewith are enclosed in said first electrostatic shield, the latter being coupled to said local ground reference potential of said emission tip.

3. The beam regulating means claimed in claim 2 further including a second electrostatic shield and wherein said first electrostatic shield is enclosed within, and is insulated from said second electrostatic shield, the latter being coupled to said second terminal of said accelerating potential power source, and wherein said current measuring circuitry is coupled to said first and said second electrostatic shields for measuring said beam current.

4. The beam regulating means claimed in claim 3 wherein said accelerating power source is coupled to said second shield to apply a positive potential referenced to said earth grounded sample electrode whereby said emission tip produces a positive ion beam.

5. The beam regulating means claimed in claim 3 wherein said accelerating power source is coupled to said second shield to apply a negative potential referenced to said earth grounded sample electrode whereby said emission tip produces an electron beam.

6. The beam regulating means claimed in claim 5 wherein said emission gun system further includes a first accelerating anode positioned in the path of said electron beam, said accelerating anode having an aperture for passing a portion of said electron beam to said sample electrode, said accelerating anode being at a positive potential with respect to said local ground potential of said emission tip and being provided with said positive potential from a power source located within said first electrostatic shield.

7. A field emission gun with noise compensation comprising;

emission tip means for emitting a current beam, high voltage power source means for providing an accelerating potential to the emitted beam, sample electrode means positioned so as to be in the path of the emitted beam, said sample electrode means being connected to said power source means and to earth ground, first shield means enclosing said emission tip means and connected thereto and to a potential other than earth ground, second shield means enclosing said first shield means and insulated therefrom and connected to said power source means on the side opposite said earth ground, current measuring circuitry enclosed within said first and second shield means, connected thereto to measure the current between said shield means, and to produce an output voltage signal in proportion to said measured current, and a control electrode positioned near the emission tip means and within said first shield means to control the current emitted therefrom according to the output voltage signal.

* * * * *